(12) United States Patent
Kadin

(10) Patent No.: US 11,119,483 B2
(45) Date of Patent: Sep. 14, 2021

(54) SYSTEM AND METHOD FOR CONSCIOUS MACHINES

(71) Applicant: Alan M. Kadin, Princeton Junction, NJ (US)

(72) Inventor: Alan M. Kadin, Princeton Junction, NJ (US)

( * ) Notice: Subject to any disclaimer, the term of this patent is extended or adjusted under 35 U.S.C. 154(b) by 290 days.

(21) Appl. No.: 16/281,956

(22) Filed: Feb. 21, 2019

(65) Prior Publication Data

US 2019/0258254 A1 Aug. 22, 2019

Related U.S. Application Data

(60) Provisional application No. 62/633,950, filed on Feb. 22, 2018.

(51) Int. Cl.
| | |
|---|---|
| *G05D 1/00* | (2006.01) |
| *G06K 9/46* | (2006.01) |
| *B60W 50/14* | (2020.01) |
| *G06N 3/00* | (2006.01) |
| *G05D 1/02* | (2020.01) |
| *G06F 30/20* | (2020.01) |

(52) U.S. Cl.
CPC ......... *G05D 1/0088* (2013.01); *G05D 1/0221* (2013.01); *G06F 30/20* (2020.01); *G06N 3/006* (2013.01)

(58) Field of Classification Search
CPC ..... G05D 1/00; G06K 9/46; B25J 9/16; G01S 17/89; B60W 50/14; G08G 1/16; G06F 7/00

See application file for complete search history.

(56) References Cited

U.S. PATENT DOCUMENTS

| | | | | |
|---|---|---|---|---|
| 10,759,446 | B2* | 9/2020 | Motomura | G08G 1/0141 |
| 2012/0253549 | A1* | 10/2012 | Cund | G01S 13/584 |
| | | | | 701/1 |
| 2014/0195132 | A1* | 7/2014 | Cund | G01S 13/931 |
| | | | | 701/70 |
| 2018/0336431 | A1* | 11/2018 | Kadav | G06N 3/0445 |
| 2018/0348374 | A1* | 12/2018 | Laddha | G01S 7/4808 |
| 2019/0039239 | A1* | 2/2019 | Phoenix | G06N 3/0454 |

* cited by examiner

*Primary Examiner* — Yuri Kan

(74) *Attorney, Agent, or Firm* — Hoffberg & Associates; Steven M Hoffberg

(57) ABSTRACT

Consciousness is widely considered to be a mysterious and uniquely human trait, which cannot be achieved artificially. On the contrary, a system and method are disclosed for a computational machine that can recognize itself and other agents in a dynamic environment, in a way that seems quite similar to biological consciousness in humans and animals. The machine comprises an artificial neural network configured to identify correlated temporal patterns and attribute causality and agency. The machine is further configured to construct a virtual reality environment of agents and objects based on sensor inputs, to create a coherent narrative, and to select future actions to pursue goals. Such a machine may have application to enhanced decision-making in autonomous vehicles, robotic agents, and intelligent digital assistants.

20 Claims, 9 Drawing Sheets

SYSTEM AND METHOD FOR CONSCIOUS MACHINES

CROSS REFERENCE TO RELATED APPLICATIONS

The present application is a non-provisional of, and claims benefit of priority from, U.S. Provisional Patent Application No. 62/633,950, filed Feb. 22, 2018, the entirety of which is expressly incorporated herein by reference.

FIELD OF THE INVENTION

The present invention relates to the field of artificial intelligence, and more particularly to self-aware automatons.

BACKGROUND OF THE INVENTION

Since the beginning of computer technology in the mid-$20^{th}$ century, computers have commonly been characterized as "electronic brains", but this is based on several misunderstandings. First, computers, going back to their origins by Turing and Von Neumann, were designed to carry out arithmetic and logic operations, as in the classic Von Neumann computer architecture of FIG. 1 (see, for example, en.wikipedia.org/wiki/Von_Neumann architecture). In contrast, biological brains have evolved to match patterns, and are organized quite differently on both the "device" and "architectural" levels. This distinction has been recognized in the prior art, and led to the development of computational systems known as "artificial neural networks" (also known as "Neural Networks", see, for example, en.wikipedia.org/wiki/Artificial_neural_network), comprising an interconnected network of artificial neurons, as shown in FIG. 2, connected via an array of artificial synapses. See:

Schmidhuber, Jürgen. "Deep learning in neural networks: An overview." *Neural networks* 61 (2015): 85417.

Grossberg, Stephen. "Nonlinear neural networks: Principles, mechanisms, and architectures." *Neural networks* 1, no. 1 (1988): 17-61.

Kosko, Bait *Stability and Adaptation of Neural Networks*. University Of Southern California Los Angeles Signal And Image Processing Inst, 1990.

Bishop, Christopher M. *Neural networks for pattern recognition*. Oxford university press, 1995.

Rumelhart, David E., Geoffrey E. Hinton, and Ronald J. Williams. *Learning internal representations by error propagation*. No. ICS-8506. California Univ San Diego La Jolla Inst for Cognitive Science, 1985.

Vapnik, Vladimir. *The nature of statistical learning theory*. Springer science & business media, 2013.

Kohonen, Teuvo. "The self-organizing map." *Neurocomputing* 21, no. 1-3 (1998): 1-6.

Duda, Richard O., Peter E. Hart, and David G. Stork. *Pattern classification*. John Wiley & Sons, 2012.

Vapnik, Vladimir Naumovich. "An overview of statistical learning theory." *IEEE transactions on neural networks* 10, no. 5 (1999): 988-999.

Hagan, Martin T and Mohammad B. Menhaj. "Training feed forward networks with the Marquardt algorithm." *IEEE transactions on Neural Networks* 5, no. 6 (1994): 989-993.

Rumelhart, David E., Geoffrey E. Hinton, and Ronald J. Williams. "Learning representations by back-propagating errors." *nature* 323, no. 6088 (1986): 533.

Rumelhart, David E., James L. McClelland, and PDP Research Group. *Parallel distributed processing. Vol. 1*. Cambridge, Mass.: MIT press, 1987.

Hopfield, John J. "Neural networks and physical systems with emergent collective computational abilities." *Proceedings of the national academy of sciences* 79, no. 8 (1982): 2554-2558.

Hertz, John, Anders Krogh, and Richard G. Palmer. *Introduction to the theory of neural computation*. Addison-Wesley/Addison Wesley Longman, 1991.

Cortes, Corinna, and Vladimir Vapnik. "Support-vector networks." *Machine learning* 20, no. 3 (1995): 273-297.

Narendra, Kumpati S., and Kannan Parthasarathy. "Identification and control of dynamical systems using neural networks," *IEEE Transactions on neural networks* 1, no. 1 (1990): 4-27.

Hebb, Donald Ming, *The organization of behavior: A neuropsychological theory*. Psychology Press, 2005.

Broomhead, David S., and David Lowe. *Radial basis functions, multi-variable functional interpolation and adaptive networks*. No. RSRE-MEMO-4148. Royal Signals and Radar Establishment Malvern (United Kingdom), 1988.

Rosenblatt, F. "The Perceptron: A Probabilistic Model For Information Storage And Organization In The Brain." *Psychological Review* 65, no. 6: 1958.

Burges, Christopher J C. "A tutorial on support vector machines for pattern recognition." *Data mining and knowledge discovery* 2, no. 2 (1998): 121-167.

Poggio, Tomaso, and Federico Girosi. "Networks for approximation and learning." *Proceedings of the IEEE* 78, no. 9 (1990): 1481-1497.

Neural networks comprise massive parallelism with distributed computing and memory, in contrast to the centralized arithmetic/logic unit and separate memory of the classic von Neumann computer. Neural networks provide an example of brain-inspired or "neuromorphic" computing, which emulates one or more aspects of biological information processing. Biological neurons conduct voltage spikes, but this aspect is not essential for neural networks. Several variants of neural networks have been recognized in the prior art, including recurrent and convolutional neural networks, reflecting different degrees of feedback and feedforward circuits. Note that von Neumann computers can simulate neural networks, but not with the efficiency and speed of neural network hardware.

Brains in biological systems are based on large arrays of neurons, where each neuron may have thousands of synapses connecting it to other neurons. For example, the cerebral cortex of a mouse may have about 4 million neurons, and that of a human may have 16 billion neurons. See, for example, en.wikipedia.org/wiki/List_of animals_by_number_of neurons. In comparison, the neuromorphic chip from IBM known as True North comprises one million artificial neurons, each with 256 synapses; see en.wikipedia.org/wiki/TrueNorth.

A related aspect of the prior art has been the field of "artificial intelligence" (AI), which has focused on emulating some of the functionality of biological intelligent systems (see for example en.wikipedia.org/wiki/Artificial_intelligence). Early AI systems comprised a body of knowledge in a particular topic, and a set of rules on how to apply this knowledge. This may be analogous to biological systems that operate on instinct, where the rules are pre-programmed and rigid, and the biological system is not generally viewed as particularly intelligent. Such an AI system may be implemented in software based on conventional computer hardware. More recent AI systems have comprised neural networks with multiple "hidden layers" between input and output, which are capable of learning or training; the term "deep learning" has been applied to some of these systems (see, for example, en.wikipedia.org/wiki/Deep_learning). The training may comprise both supervised and unsupervised learning. Some deep learning systems have been very effective at showing human-like knowledge in games and in expert systems, such as IBM Watson (see en.wikipedia.org/wiki/Watson_(computer)).

One biological aspect that has not significantly been implemented in prior-art computing technology is biological consciousness. See, for example, en.wikipedia.org/wiki/Artificial_consciousness; also non-patent literature R. Manzotti 2013, "Machine Consciousness: A Modern Approach", Natural Intelligence: The INNS Mag., vol. 2, pp. 7-18; J. A. Reggia 2013, "The Rise of Machine Consciousness: Studying Consciousness with Computational Models", Neural Networks 44, pp. 112-131. Robots with human-like consciousness have of course been a mainstay of science fiction, but there have been few practical disclosures or demonstrations of how this property may be synthesized artificially, and these have not been clear and complete. Much of the difficulty is that the property of consciousness in biological systems is not well defined or understood, so it is unclear how to address this. Consciousness is generally viewed as more of a question in philosophy or religion, rather than science or technology. This is because the key aspect of consciousness that is perceptible to humans is the recognition of self, separate from the rest of the world. This perception forms the basis for Cartesian dualism, also known as mind-body dualism, which argues that the mind is of a different nature than the physical world.

Ever since digital computers were first developed in the 1950s, they were commonly thought of as "electronic brains". But traditional computers are actually quite different from brains, both in structure and capabilities. However, recent research in alternative computer architectures, combined with research on the brain, has shown that "neuromorphic" computer architectures may finally be emulating brains more closely.

This difference can be seen in FIG. 1 and FIG. 2 of the prior art, which compare a traditional von Neumann computer architecture to a neural network. The von Neumann architecture in FIG. 1 extended a simple mathematical model of a computer proposed by Alan Turing, and was brought to practical fruition under the direction of John von Neumann at the Institute for Advanced Study in Princeton in the 1950s. This architecture consists basically of an arithmetic engine with a control program and memory. Virtually all practical computers since then have had the same basic structure. Even modern supercomputers with multiple processors and memory hierarchies are based on this original design.

Compare this to a basic design of an artificial neural network (or neural net) shown in FIG. 2. This represents an array of artificial neurons (which may be electronic elements or circuits) organized into layers and connected with "synapses". The strength of a given synapse may be changed according to a procedure of iterative training or learning, rather than an imposed program. The collection of synapse strengths correspond to memory, but are distributed throughout the system, rather than localized in a single module. Furthermore, there is no central processing unit; the processing is also distributed. This structure is similar in several respects to the interconnections between biological neurons, although it is much simpler.

The von Neumann architecture represents a universal computer, so that it can be used to simulate any other computer architecture, including a neural net. But such a simulation would be very inefficient and slow. In fact, a traditional processor works very well in doing mathematical calculations, whereas brains do mathematics rather poorly. On the other hand, brains have evolved to match patterns, and do this very well. Pattern matching is not limited to image recognition, but occurs in all sensory processing, memory retrieval, language translation, and a host of correlation and optimization problems. Recent research has shown that neural nets with many "hidden layers" between the input and output can be trained to be particularly efficient in learning to match patterns; this is known as "deep learning". More hidden layers enable more abstract correlations among inputs, which in turn enables more flexible recognition of a wider variety of complex patterns. The learning process itself is adaptive in a way that is similar to evolution. The environment selects those variations that are most effective in matching the training patterns.

Another important aspect of brains is that they are composed of basic elements (the neurons) that are slow, noisy, and unreliable. But despite this, brains have evolved to respond quickly in complex environments, by taking advantage of distributed computing with massive parallelism, and neural nets are uniquely capable to taking full advantage of this. It is remarkable that transistors, the basic elements of modern computers, are now a million times faster than biological neurons (characteristic times of nanoseconds rather than milliseconds), but brains are still far faster and more energy-efficient than traditional supercomputers in the types of pattern matching tasks for which brains have evolved. A computer with a brain-like organization but electronic speed would represent a major technological breakthrough.

The field of artificial intelligence is almost as old as computers themselves, but it has long fallen far short of its goals. The traditional method of artificial intelligence is to devise a list of rules about a particular topic, and program them into a conventional computer. But knowledge of a fixed set of rigid rules is not what we generally mean by intelligence. Indeed, biological organisms with very simple nervous systems, such as worms or insects, behave as if they are "hard-wired" with rule-driven behavior, and are not regarded as intelligent at all. Furthermore, sophisticated responses to dynamic environments cannot be fully programmed in advance; there must be a strong element of learning involved. In contrast, neural nets can learn how to recognize a cat, for example, without being told explicitly what defines a cat. The newer "deep learning" approach to artificial intelligence is starting to have a major impact on technology. In traditional computers, the greatest difficulty is found in writing and debugging the software. In contrast, in both natural intelligence and the newer approaches to machine learning, the software is generated automatically via learning. No programmer is necessary; as with evolution, this is unguided.

There are several patents and patent applications that propose to address artificial consciousness. There is no evidence that any of these have been reduced to practice, in whole or in part.

The set of U.S. Pat. Nos. 7,499,893, 7,849,026, 8,065,245, and 8,346,699, invented by Gregory Czora, proposes a "System and Method for Simulating Consciousness." Czora discloses a Digital Life Form that functions as a human-computer interface, which interacts with objects in an environment in a way that simulates human consciousness. It is not clear in these patents what consciousness is, or how it is to be implemented, except that it may "emerge from the interaction of the Digital Life Form with its environment and its own previous actions."

The published US patent application 2017/0236054, invented by John Carson, discloses a "Hyper Aware Logic to Create an Agent of Consciousness and Intent for Devices and Machines". Carson proposes that a set of neural logic units could create an agent that is aware of itself and its environment, and can make decisions on its own. However, Carson does not disclose an architecture or a mechanism that can create such self-awareness, beyond simply connecting sensor inputs to the neural logic units.

US patent application 2008/0256008, invented by Mitchell Kwok, discloses a "Human Artificial Intelligence Machine". This describes a self-learning, self-aware system that can identify objects in the environment and project events to the future. However, no mechanism for self-awareness is described.

US patent application 2012/0059781, invented by Nam Kim, discloses "Systems and Methods for Creating or Simulating Self-Awareness in a Machine". This describes a conscious system with an artificial personality, receiving information from sensors, but apart from a feedback signal, no basis for consciousness is given.

US patent application 2014/0046891, invented by Sarah Banas, discloses a "Sapient or Sentient Artificial Intelligence". Banas describes a system with natural language input and output that uses a neural network to provide human-like responses, and asserts that this system may be conscious or self-aware, but does not describe a mechanism for this self-awareness.

All of this prior art is missing a key element in artificial consciousness: temporal pattern recognition. Pattern or image recognition of objects in space is well known (see https://en.wikipedia.org/wiki/Pattern_recognition), and this can be extended to evolution of events in time as well.

Temporal pattern recognition has been discussed in the prior art. See, for example, the following US patents:

U.S. Pat. No. 8,583,586, "Mining temporal patterns in longitudinal event data using discrete event matrices and sparse coding", invented by S. Ebodallahi et al.

U.S. Pat. No. 8,346,692, "Spatio-temporal pattern recognition using a spiking neural network and processing thereof on a portable and/or distributed computer", invented by J. Rouat, et al.

U.S. Pat. No. 8,457,409, "Cortex-like learning machine for temporal and hierarchical pattern recognition", invented by J. T. Lo.

U.S. Pat. No. 9,177,259, "Systems and methods for recognizing d reacting to spatiotemporal patterns", invented by G. Levchuk.

U.S. Pat. No. 7,624,085, "Hierarchical based system for identifying object using spatial and temporal patterns," invented by J. Hawkins and D. George.

U.S. Pat. No. 8,825,565, "Assessing performance in a spatial and temporal memory system", invented by R. Marianetti et al.

Another prior art technology that may be relevant to artificial consciousness in the present application is virtual reality, whereby a computer creates a simulated environment through which an observer can move. See, for example, en.wikipedia.org/wiki/Virtual_reality. Such a virtual reality environment may comprise elements derived from one or more real environments, as well as simulations from models. Some prior art of this type may be known as augmented reality, mixed reality, or hybrid reality. There are many patents in this field, for example the following US patents:

U.S. Pat. No. 9,251,721, "Interactive mixed reality systems and uses thereof," invented by S. Lampotang et al.

U.S. Pat. No. 9,677,840, "Augmented reality simulator," invented by S. Rublowsky.

U.S. Pat. No. 9,318,032, Hybrid physical-virtual reality simulation for clinical training, invented by J. Samosky.

U.S. Pat. No. 9,407,904, Method of obtaining 3D virtual reality from 2D images, invented by J. Sandrew et al.

Finally, there are different concepts of what capabilities would define a conscious machine, and how its consciousness could be recognized. In one variant, the machine would be able to converse in natural language with a person (perhaps remotely), who could determine by questions and answers whether this was really a machine. This is the basis for the classic Turing test of machine intelligence (see en.wikipedia.org/wiki/Turing_test), where a machine is considered intelligent if it can fool a human into thinking it is another human. This may not be definitive, since humans are predisposed to see human agency in others, and can easily be fooled. In the present application, a more general class of consciousness is considered, which might be analogous to that in a trainable animal. Such a machine need not have full language capabilities, but might exhibit flexibility and rapid decision-making in a variety of environments.

What is needed is a computing machine that is designed to implement a form of biological consciousness, comprising recognition of self in a virtual environment.

See, U.S. Pat. Nos. 5,602,964; 5,943,663; 6,016,447; 6,016,448; 6,154,675; 7,433,482; 7,570,991; 7,627,538; 7,765,171; 7,835,858; 7,877,347; 7,899760; 7,904,396; 7,925,600; 8,014,937; 8,041,655; 8,099,181; 8,112,373; 8,135,655; 8,138,770; 8,140452; 8,140,453; 8,160,978; 8,165,916; 8,165,976; 8,165,977; 8,175,896; 8,229,221; 8,239,336; 8,260733; 8,271,411; 8,275,725; 8,290,768; 8,352,400; 8,364,136; 8,369,967; 8,380,530; 8,386,378; 8,402490; 8,426,531; 8,452,719; 8,458,082; 8,468,244; 8,516,266; 8,521,488; 8,548,231; 8,554,468; 8,554,707; 8,566,263; 8,566,264; 8,572,012; 8,583,263; 8,583,574; 8,595,165; 8,600,926; 8,639,629; 8,645,292; 8,645,312; 8,650,149; 8,655,829; 8,674,706; 8,676,742; 8,682,812; 8,694,442; 8,694,449; 8,694,457; 8,719,213; 8,738,562; 8,756,077; 8,766,982; 8,768,838; 8,781,982; 8,811,532; 8,818,917; 8,818,931; 8,843,433; 8,862,527; 8,892,495; 8,928,232; 8,929,612; 8,930,178; 8,930,268; 8,934,375; 8,934,445; 8,934,965; 8,941,512; 8,942,436; 8,942,466; 8,945,829; 8,949,082; 8,949,287; 8,955,383; 8,958,386; 8,958,605; 8,959,039; 8,964,719; 8,965,677; 8,965,824; 8,971,587; 8,972,316; 8,976,269; 8,977,582; 8,977,629; 8,983,216; 8,983,882; 8,983,883; 8,983,884; 8,989,515; 8,990,133; 9,002,682; 9,002,762; 9,002,776; 9,007,197; 9,008,840; 9,009,088; 9,009,089; 9,014,416; 9,015,092; 9,015,093; 9,017,656; 9,024,906; 9,031,844; 9,032,537; 9,037,464; 9,037,519; 9,047,561; 9,047,568; 9,052,896; 9,053,431; 9,058,515; 9,058,580; 9,060,392; 9,063,953; 9,064,161; 9,069,730; 9,070,039; 9,078,629; 9,082,079; 9,082,083; 9,091,613; 9,092,692; 9,092,737; 9,092,738; 9,098,811; 9,098,813; 9,101,279; 9,102,981; 9,103,671; 9,103,837; 9,104,186; 9,104,973; 9,106,691; 9,111,215; 9,111,226; 9,115,122; 9,117,133; 9,117,176; 9,122,956; 9,122,994; 9,123,127; 9,127,313; 9,128,203; 9,129,167; 9,129,190; 9,129,221; 9,135,241; 9,137,417; 9,141,906; 9,141,926; 9,146,546; 9,147,144; 9,147,154; 9,147,156; 9,152,853; 9,152,881; 9,152,888; 9,152,915; 9,153,024; 9,155,487; 9,156,165; 9,157,308; 9,158,967; 9,159,021; 9,159,027; 9,159,584; 9,165,187; 9,165,188; 9,165,245;

9,165,259; 9,171,202; 9,171,204; 9,171,247; 9,171,262; 9,171,263; 9,173,614; 9,175,352; 9,177,476; 9,177,550; 9,180,309; 9,183,493; 9,189,472; 9,189,730; 9,189,745; 9,189,749; 9,190,053; 9,191,138; 9,193,075; 9,194,803; 9,195,865; 9,195,934; 9,195,949; 9,202,178; 9,202,203; 9,202,462; 9,203,553; 9,203,911; 9,203,912; 9,208,431; 9,208,443; 9,208,536; 9,209,782; 9,210,708; 9,211,314; 9,213,885; 9,213,937; 9,217,775; 9,218,563; 9,218,573; 9,219,572; 9,220,634; 9,224,035; 9,224,068; 9,224,090; 9,226,676; 9,229,910; 9,235,799; 9,235,887; 9,239,951; 9,239,985; 9,251,420; 9,251,437; 9,253,349; 9,256,215; 9,256,322; 9,256,823; 9,262,724; 9,263,060; 9,268,058; 9,268,990; 9,269,040; 9,275,308; 9,275,326; 9,286,524; 9,290,010; 9,292,012; 9,298,172; 9,302,103; 9,302,179; 9,307,944; 9,308,445; 9,311,298; 9,311,531; 9,311,593; 9,311,594; 9,311,595; 9,311,596; 9,311,670; 9,311,915; 9,317,727; 9,317,728; 9,317,740; 9,324,022; 9,324,154; 9,324,321; 9,330,119; 9,333,415; 9,336,239; 9,336,480; 9,336,482; 9,336,781; 9,342,742; 9,342,781; 9,344,211; 9,351,378; 9,355,312; 9,366,451; 9,367,490; 9,367,602; 9,367,798; 9,367,799; 9,370,316; 9,373,038; 9,373,057; 9,373,059; 9,373,324; 9,378,464; 9,378,731; 9,378,733; 9,384,334; 9,384,335; 9,389,260; 9,390,371; 9,390,373; 9,390,712; 9,391,789; 9,396,374; 9,396,388; 9,396,523; 9,400,589; 9,401,148; 9,405,751; 9,405,975; 9,406,017; 9,412,009; 9,412,041; 9,412,064; 9,412,065; 9,417,700; 9,418,334; 9,418,390; 9,423,403; 9,424,489; 9,424,512; 9,428,767; 9,430,667; 9,430,817; 9,434,937; 9,436,909; 9,436,913; 9,449,225; 9,449,271; 9,449,336; 9,451,899; 9,452,346; 9,454,729; 9,454,730; 9,454,958; 9,456,131; 9,460,387; 9,460,400; 9,460,557; 9,460,711; 9,461,535; 9,471,869; 9,472,187; 9,477,625; 9,477,654; 9,477,655; 9,477,901; 9,477,906; 9,477,925; 9,480,402; 9,482,672; 9,483,794; 9,484,015; 9,484,016; 9,489,621; 9,489,623; 9,494,602; 9,495,395; 9,495,414; 9,507,983; 9,508,026; 9,508,164; 9,508,340; 9,511,274; 9,514,357; 9,514,389; 9,514,405; 9,514,753; 9,519,859; 9,520,127; 9,524,462; 9,525,699; 9,528,834; 9,529,794; 9,530,047; 9,530,091; 9,532,762; 9,533,113; 9,534,234; 9,535,563; 9,535,960; 9,542,553; 9,542,626; 9,547,804; 9,552,544; 9,552,546; 9,552,547; 9,552,551; 9,558,742; 9,563,840; 9,569,650; 9,570,069; 9,573,277; 9,574,209; 9,575,070; 9,576,214; 9,580,697; 9,589,565; 9,590,425; 9,591,580; 9,594,983; 9,595,002; 9,598,734; 9,607,355; 9,607,616; 9,609,436; 9,609,904; 9,612,248; 9,613,292; 9,613,297; 9,613,466; 9,613,619; 9,614,724; 9,619,749; 9,619,881; 9,619,883; 9,620,145; 9,621,681; 9,623,905; 9,626,566; 9,630,005; 9,630,011; 9,630,348; 9,631,936; 9,631,943; 9,638,678; 9,640,186; 9,644,847; 9,646,244; 9,646,634; 9,651,519; 9,652,712; 9,655,564; 9,663,831; 9,665,100; 9,665,822; 9,665,823; 9,668,075; 9,671,953; 9,672,609; 9,677,109; 9,678,059; 9,679,108; 9,679,258; 9,681,250; 9,681,815; 9,687,208; 9,687,377; 9,689,826; 9,690,293; 9,690,776; 9,691,020; 9,692,662; 9,696,719; 9,697,200; 9,697,826; 9,697,833; 9,700,785; 9,703,929; 9,704,068; 9,705,998; 9,707,282; 9,709,986; 9,710,606; 9,710,852; 9,713,982; 9,714,420; 9,720,907; 9,721,202; 9,721,214; 9,721,338; 9,721,384; 9,721,561; 9,721,562; 9,725,769; 9,727,042; 9,728,184; 9,730,098; 9,730,660; 9,732,385; 9,734,292; 9,734,824; 9,735,833; 9,740,680; 9,740,782; 9,747,543; 9,753,796; 9,754,080; 9,754,163; 9,754,371; 9,754,584; 9,757,561; 9,758,839; 9,760,090; 9,760,676; 9,767,385; 9,767,410; 9,778,021; 9,778,807; 9,779,204; 9,779,727; 9,779,786; 9,782,585; 9,784,748; 9,786,270; 9,788,179; 9,789,313; 9,792,492; 9,792,501; 9,792,531; 9,796,479; 9,798,922; 9,799,098; 9,799,327; 9,801,066; 9,802,042; 9,805,399; 9,805,716; 9,811,718; 9,811,775; 9,817,399; 9,818,136; 9,818,239; 9,822,389; 9,824,060; 9,824,294; 9,824,684; 9,826,351; 9,830,315; 9,833,184; 9,836,455; 9,836,671; 9,836,883; 9,839,552; 9,842,106; 9,842,302; 9,842,585; 9,842,610; 9,846,836; 9,847,974; 9,848,112; 9,848,827; 9,849,044; 9,853,951; 9,858,263; 9,858,340; 9,858,496; 9,858,529; 9,864,953; 9,870,589; 9,870,617; 9,870,629; 9,870,630; 9,874,914; 9,875,440; 9,875,567; 9,875,737; 9,881,349; 9,881,613; 9,881,615; 9,886,949; 9,891,716; 9,892,420; 9,895,077; 9,900722; RE45768; RE45770; RE46310; 20010028339; 20010034478; 20010049585; 20020013664; 20020032670; 20020066024; 20020069043; 20020078368; 20020091655; 20020099675; 20020102526; 20020151992; 20020172403; 20030007674; 20030023386; 20030055516; 20030055610; 20030065633; 20030089218; 20030158768; 20030187587; 20030190603; 20030191728; 20030194124; 20030212645; 20030225715; 20030235816; 20040015894; 20040019283; 20040019469; 20040042662; 20040056174; 20040072162; 20040073376; 20040076984; 20040086162; 20040101181; 20040121487; 20040127778; 20040133533; 20040143725; 20040148265; 20040181497; 20040193559; 20040213448; 20040220891; 20040233233; 20050004883; 20050019798; 20050058242; 20050080462; 20050086186; 20050090991; 20050100208; 20050104603; 20050108200; 20050117700; 20050169516; 20050213802; 20050240085; 20050267011; 20050267688; 20050276485; 20050282146; 20050282199; 20060017578; 20060018524; 20060024679; 20060031764; 20060056704; 20060067573; 20060094001; 20060098876; 20060155398; 20060195266; 20060200253; 20060200258; 20060200259; 20060200260; 20060262726; 20070016476; 20070022062; 20070038588; 20070043452; 20070053513; 20070061022; 20070061023; 20070061735; 20070070038; 20070094166; 20070111269; 20070134725; 20070168227; 20070185825; 20070239635; 20070239644; 20070244375; 20080014646; 20080033658; 20080040749; 20080095429; 20080152217; 20080267999; 20080270120; 20080281767; 20090018940; 20090041187; 20090043547; 20090104602; 20090132449; 20090206234; 20090271344; 20090307165; 20100049339; 20100067786; 20100070098; 20100076642; 20100077840; 20100085066; 20100094788; 20100161530; 20100185573; 20100189342; 20100217145; 20100228694; 20100278420; 20100316283; 20110029922; 20110033122; 20110047110; 20110055131; 20110156896; 20110167110; 20110257950; 20110276344; 20110288890; 20120017232; 20120036016; 20120041158; 20120041915; 20120150651; 20120213331; 20130018833; 20130147598; 20130243122; 20130342681; 20140000347; 20140005958; 20140058735; 20140089241; 20140173452; 20140333326; 20140364721; 20150046354; 20150081280; 20150204559; 20150204725; 20150269439; 20150377667; 20160034814; 20160035093; 20160098629; 20160196480; 20160282351; 20160300127; 20160350834; 20170011279; 20170011280; 20170024877; 20170039186; 20170073737; 20170140262; 20170154258; 20170154259; 20170161590; 20170169331; 20170169357; 20170193298; 20170286810; 20170337587; 20170363475; and 20180018553.

All patent and non-patent references cited herein are expressly incorporated herein by reference in their entirety.

SUMMARY OF THE INVENTION

We are all conscious, which might seem to make us all experts in consciousness. However most of our internal observations about consciousness are illusions, as shown by psychological research. We believe that there is a unified conscious mind which controls everything we do. However, most of our actions are actually controlled subconsciously by components of an unconscious mind, even if the conscious mind takes credit for the actions. This is represented in FIG. 3, which shows a conscious mind (C) above an unconscious mind (U), which in turn is above an external environment (E). A good analogy is with the Chairman of the Board (C) of a corporation, who believes that he runs the corporation single-handedly, and is encouraged in this belief by his underlings (U). In fact, all routine actions are carried out by U, independently of C. Only those non-routine actions which require a decision are brought to the attention of C. Even then, U prepares a simplified model of the alternatives and their future implications to C, generally as a binary decision. This simplified model is designed to insure a rapid decision, and may have embedded assumptions that are hidden from C. C believes that it is making an unbiased decision based on all the evidence, but this, too, is an illusion. A machine emulation of consciousness may exhibit a similar structure.

According to the present application, consciousness represents the functioning of a specific architecture of a neural network that features self-recognition as a primary aspect.

In a preferred embodiment of the invention, a conscious machine similarly comprises a consciousness computing module, together with an unconscious computing module, as shown in the block diagram of FIG. 4. The consciousness computing module constitutes a dynamic virtual reality environment, comprising the self, objects, and other agents. The unconscious module comprises a computational engine that accepts input from an external physical environment and generates control outputs to the external environment, as well as generating the virtual reality environment. The internal sense of consciousness is associated with the activation of the virtual reality environment, which provides a coherent narrative of the self, interacting with other components of the virtual reality environment. The virtual reality environment comprises a representation of the external environment, but they are not the same.

The virtual reality environment thus represents a subjective model of the external physical environment, and which differs from the external physical environment based on limited information, abstraction of patterns and features, biases, etc.

The input information to generate the virtual reality environment may comprise visual images, auditory signals, local contact sensor information ("sense of touch"), and electronic information signals from the external reality. Of course, the inputs are not limited, and may comprise any type of sensor, local or remote database, or borrowed virtual reality environments of other systems.

The virtual reality environment is comprised of a plurality of objects that may interact, rather than merely images and signals. In effect, the external reality environment is deconstructed or partitioned into objects, and the objects are combined to reconstruct the virtual reality environment. An object represents an element in the external environment that maintains integrity in space and time, and is linked to memory of similar elements in previous environments (external and virtual). The class of similar objects may be recognized by common features or attributes, such as size, shape, solidity, deformability, hardness, coldness, color, etc.

Typically, the virtual reality environment will conform to the laws of physics, though this is a requirement only for physically-accurate models. In some cases, deviations from the laws of physics in the virtual reality environment may be employed.

While some objects are passive, a special type of object is active, i.e., is an agent. An agent can alter the environment, moving itself or other objects. For example, consider FIG. 5, which represents the location of an object and an agent in an environment. This shows an initially stationary object, together with an agent that moves to the position of the object, followed by motion of the object. The neural network in the unconscious module is configured to use pattern matching to recognize that the motion of the agent is correlated with the motion of the object. In natural environments, such correlation is generally due to causality, and the unconscious module further generates a model of the agent moving continuously in the virtual environment, causing the object to move. Such a model not only describes past actions in the environment, it also enables predictions of future actions by extrapolation.

The virtual reality environment operates according to predictable rules and properties, and therefore may be used to explore cause-and-effect prior to taking action in the real world. This can be especially useful where the real world includes another independent agent, or a task is or seems to be intractable or NP hard. In these cases, the machine may explore possible actions in the virtual reality environment, including multi-step actions, to predict outcomes in the real world. The exploration may consider both outcome per se, and risks and margins of error/safety.

A special type of agent is the self, the activity of which is correlated with control outputs and local sensor inputs. The self comprises the image of the self in the virtual environment, together with filtered versions of these control outputs and local sensor inputs. Recognition of the self comprises matching the present self with that in recent and earlier memories of the self. Other agents are distinguished by NOT being correlated with control outputs and local sensor inputs, e.g., they act independently. The unconscious module further generates a model of the self in the virtual environment, capable of accounting for past actions and future predictions (see FIG. 6). The repeated activation of this model of the self as an agent in the virtual environment is directly analogous to what we ourselves experience as a sense of consciousness. This model of the self may also comprise a set of goals and a simplified narrative. It may also include a set of positive and negative associations (based on pre-programming or learned from prior experiences), that may be analogous to emotions in biological consciousness.

It is suggested that biological consciousness defined in this way is not uniquely human, but is widespread in the animal kingdom. Human consciousness may have additional properties of abstract language and abstract logical processing, but may otherwise be similar to that in animals. Machine consciousness as described herein may be useful even with very limited conscious-level language and logical processing, perhaps analogous to that in a horse, for example.

When a decision between alternative future actions is necessary, two or more future predictions may be projected within the model, and the futures evaluated according to a predetermined (or learned) set of goals. This may provide an example of a conscious-level decision, but other decisions may be made sub-consciously, and justified after the fact. The perception of conscious-level unified control may be a reflection of operation of self-recognition circuits, rather than actual control by the model of the conscious self.

A key aspect of temporal pattern recognition in human cognition is the role of continuity of actions in time and space. While perception of time appears to be continuous, it may actually be discrete, with a small time step. Conventional video technologies are all based on discrete time, but appear continuous. Further, memories are stored with time references, even if the reference clock may not be absolutely calibrated. But what we remember is not raw sensor data, but rather the narrative of the virtual reality at a given time. Key memories are those actions that were noticed at the time they were happening; thus, it makes little sense to try to recall an aspect that was not noticed at the time—that level of detail was not part of the initial memory. In some cases, this level of filtering and abstraction of memories is not limiting on a machine. For example, a machine may model the environment, and predict future outcomes for a series of actions, to some limit, e.g., 1 hour or five successive actions. However, as time passes, or additional successive actions are performed, the error between the prediction and the actual outcome may be more accurately determined, and factors or facts other than, or in addition to, those which were a part of the initial narrative may be included within the memories, whether or not they were initially noticed or given significance at the time they were happening. Of course, such retroactive supplementation of the database, memories, or training consumes processing power, and therefore a balance must be maintained between ability to take the best current action based on the current memories, and seeking to improve future performance by reprocessing old data. Typically, the reprocessing task may be accomplished outside of the situational awareness in the real-time response system, and therefore represents a supplement to the core functionality of the agent. However, learning from mistakes and improvement of predictive performance, i.e., seeking to model the environment in the virtual reality environment using the most important factors (similar to "principal components"), in a dynamic way is an important feature for sustained usefulness.

Similarly, the memory structure of a conscious machine of the present invention would include memories of trajectories in time from the present and recent past, as shown in FIG. 7. They would also include projections to the future, which are then mapped onto the present, and moved to the past. Memories from the more distant past may be stored in a similar way, although they may be stored in a different location. All of these permit the re-enactment of past events, in a way similar to how they were experienced at the time. Memories may be time-stamped by a clock, so that they may be retrieved by reference to the time, or alternatively by reference to content contained in the memory.

FIG. 7 suggests that sequential memories in time may be located in adjacent memory addresses, and are shifted to the past as triggered by a clock, similar to a shift register. However, in an alternative embodiment, the memories may be static and not adjacent, but may be linked together as a linked list. In that case, a moving pointer may record new memories at the front of the list.

Both the conscious module and the unconscious module may be implemented using artificial neural networks, or simulations of such networks using more conventional computer hardware. Hardware components may include graphical processing units (GPUs), tensor processing units (TPUs), field-programmable gate arrays (FPGAs), memristor arrays, or custom neuromorphic chips. The neural networks may comprise a plurality of hidden layers between input and output (see FIG. 2), in order that complex models of the self, other agents, and objects may be accommodated. The models may be trained using a real external environment, or alternatively using a simulated environment, which may be generated externally by a computer.

During and after training, the conscious module may be configured with an interface that permits the virtual reality environment to be monitored externally, on either a continuous or sporadic basis. In this way, an external user of a conscious machine may have additional information on whether the machine is operating properly. This information may be useful in accelerating training of the machine.

In a preferred embodiment of the invention, the conscious machine may be part of an autonomous or semi-autonomous vehicle. Such a vehicle could travel on roads, on the ground, on the surface of water, underwater, in the air, or in space, or in some combination of these modalities. It could be used to transport one or more people or packages between locations. Alternatively, it could record information about the environment that it passes through, and/or transmit such information to a remote location via a wireless (radio-frequency or optical) modality.

In an alternative preferred embodiment of the invention, the conscious machine may travel in an information environment, for example in a cloud computing environment or the Internet. This could provide a more efficient engine for searching a large distributed database, or for controlling a distributed sensor network, or for evaluating data from many nodes of the Internet of Things.

In yet another preferred embodiment of the invention, the conscious machine may comprise a personal digital assistant that may be carried with a person. In some cases the machine may help to guide the person through the environment, or serve to aid the memory, or otherwise anticipate the needs of the person. This may be particularly valuable for individuals who may be handicapped or unable to navigate without assistance. The conscious module may provide more rapid evaluation of incomplete data in environments that are unfamiliar to the individual.

In still another preferred embodiment, the conscious machine may comprise an autonomous or semi-autonomous robot, which may be designed to operate in a variety of complex natural and artificial environments. Such a robot, with proper initial training and continued learning, may exhibit a much greater flexibility for adaptation and autonomy in response to unpredictable events. Such a robot may be configured to interact with humans in real time via either electronic or natural language communication.

The conscious machine may be configured to communicate not only with humans, but also with other similar or complementary conscious machines. In this way, one can envision a plurality of autonomous machines acting in concert to achieve a goal, without requiring direct real-time control by humans.

The preferred embodiments presented here represent just a few examples of designs and applications of conscious machines, and others may be envisioned by those skilled in the art. It is therefore an object to provide a conscious machine that is aware of its self, where this conscious machine comprises the following components: a set of sensor inputs from an environment; an artificial neural network, receiving the set of sensor inputs, and being configured to identify the self, agents, and objects represented in the set of sensor inputs, recognize correlated patterns in time and space in the environment, and plan achievement of a goal; and at least one automated processor, configured to construct a simplified dynamical predictive model of the environment that includes the self, interacting with the agents and the objects; and a set of control outputs from the artificial neural network, dependent on the simplified dynamical predictive model, configured to alter the environment to implement the plan for achievement of the goal.

The repeated recognition of the self within the simplified dynamical predictive model of this conscious machine constitutes a primary attribute of consciousness. The conscious machine may further comprise a memory, configured to store earlier representations of the simplified dynamical predictive model, labeled by time and location in the environment, which may be retrieved either by reference to the time or the associated content of the memory.

Furthermore, the neural network may be configured to learn from experience, subject to a set of predefined guidelines. The simplified dynamical predictive model may represent a virtual reality that simulates the environment, whereby the model further comprises a causal narrative centered around the self. The model may be configured to enable prediction of alternative futures, dependent on alternative actions of the control outputs. The control outputs may be effective to alter a location monitored by the set of sensor inputs.

The sensor inputs may comprise one or more of visual images, auditory signals, natural language, or electronic signals. The environment may comprise a natural environment, an artificial environment, an environment representing an informational space, or some combination of these. The real-time state of the model may be monitored by an external user, which may be a human or alternatively another conscious machine.

The recognized self of the conscious machine may comprise an autonomous or semi-autonomous vehicle, or a robotic agent. The artificial neural network may evaluate the environment according to the effects on the self, and a portion of the evaluations may be represented as "emotions" incorporated into the model. The model may comprise an adaptive model updated to optimize a combination of fidelity to the environment, simplicity, and logical consistency.

The artificial neural network may comprise a network of interconnected physical electronic devices, each electronic device functioning as an artificial neuron. The network may comprise one or more of several electronic technologies, such as a GPU, a TPU, an FPGA, and a neuromorphic circuit. Alternatively, at least a portion of the artificial neural network may be simulated on a general purpose computer processor having an instruction fetch unit, an instruction decode unit, and an arithmetic logic unit.

It is a further object to provide an intelligent machine control method comprising the following steps: configuring an artificial neural network to accept sensor inputs from an external environment and to generate control outputs that affect the environment; recording temporal sequences in the environment in a memory; training the artificial neural network to search for correlated temporal patterns in the sensor inputs from the external environment, in order to identify self, agents, and objects in the environment; generating a simplified predictive dynamical model of the environment, that permits predictions of future events involving the self, the agents, and the objects, dependent on the control outputs; and updating the model to present a dynamic narrative of the self in the environment.

Another object provides a self-aware system, comprising: a set of sensor inputs configured to receive sensor data representing a state of an environment; and at least one automated processor comprising an artificial neural network, receiving the set of sensor inputs, configured to: identify itself, other agents, and non-agent objects represented in the set of sensor inputs; recognize correlated dynamic time and space patterns in the environment of itself, the other agents, and the non-agent objects; and construct a simplified dynamical predictive model of the environment that includes itself, interacting with the other agents and the non-agent objects; and plan achievement of a goal involving an interaction of itself with other agents and the non-agent objects in the environment, to achieve a prospective change in a relationship of at least one of itself, other agents, and non-agent objects in the environment.

Other objects will become apparent through a review of the description provided herein.

DETAILED DESCRIPTION OF THE INVENTION

Although consciousness has been difficult to define, most researchers in artificial intelligence would agree that AI systems to date have not exhibited anything resembling consciousness. Conventional views of consciousness are mostly illusory, so that a new definition of consciousness may provide a basis for developing a conscious machine. The key is pattern recognition of correlated events in time, leading to the identification of a unified self-agent.

The sense of consciousness may represent the real-time activation of neural circuits linking the present self with the past self. Such a conscious system can create a simplified virtual environment, edit it to reflect updated sensory information, and segment the environment into self, other agents, and relevant objects. It can track recent time sequences of events, predict future events based on models and patterns in memory, explore possible results of future actions, extrapolate based on past trends or experiences, and attribute causality to events and agents. It can make rapid decisions based on incomplete data, and can dynamically learn new responses based on appropriate measures of success and failure. In this view, the primary function of consciousness is the generation of a dynamic narrative, a real-time story of a self-agent pursuing goals in a virtual reality.

A conscious machine of this type may be implemented using appropriate neural networks linked to episodic memories. Near-term applications may include autonomous vehicles and flexible robotic assistants.

Figure 1:
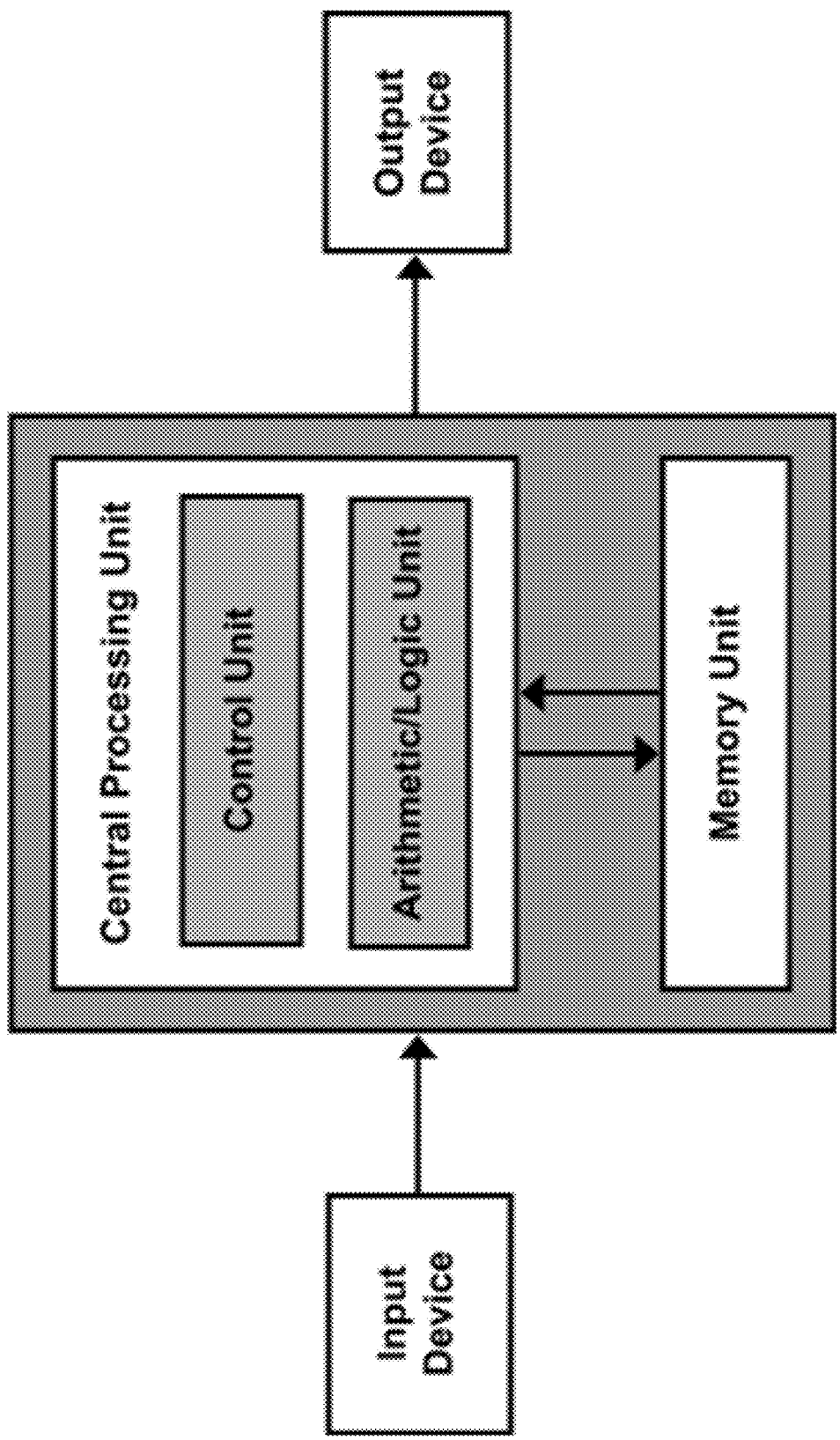
FIG. 1 shows a classic von Neumann computer architecture of the prior art.
Figure 2:
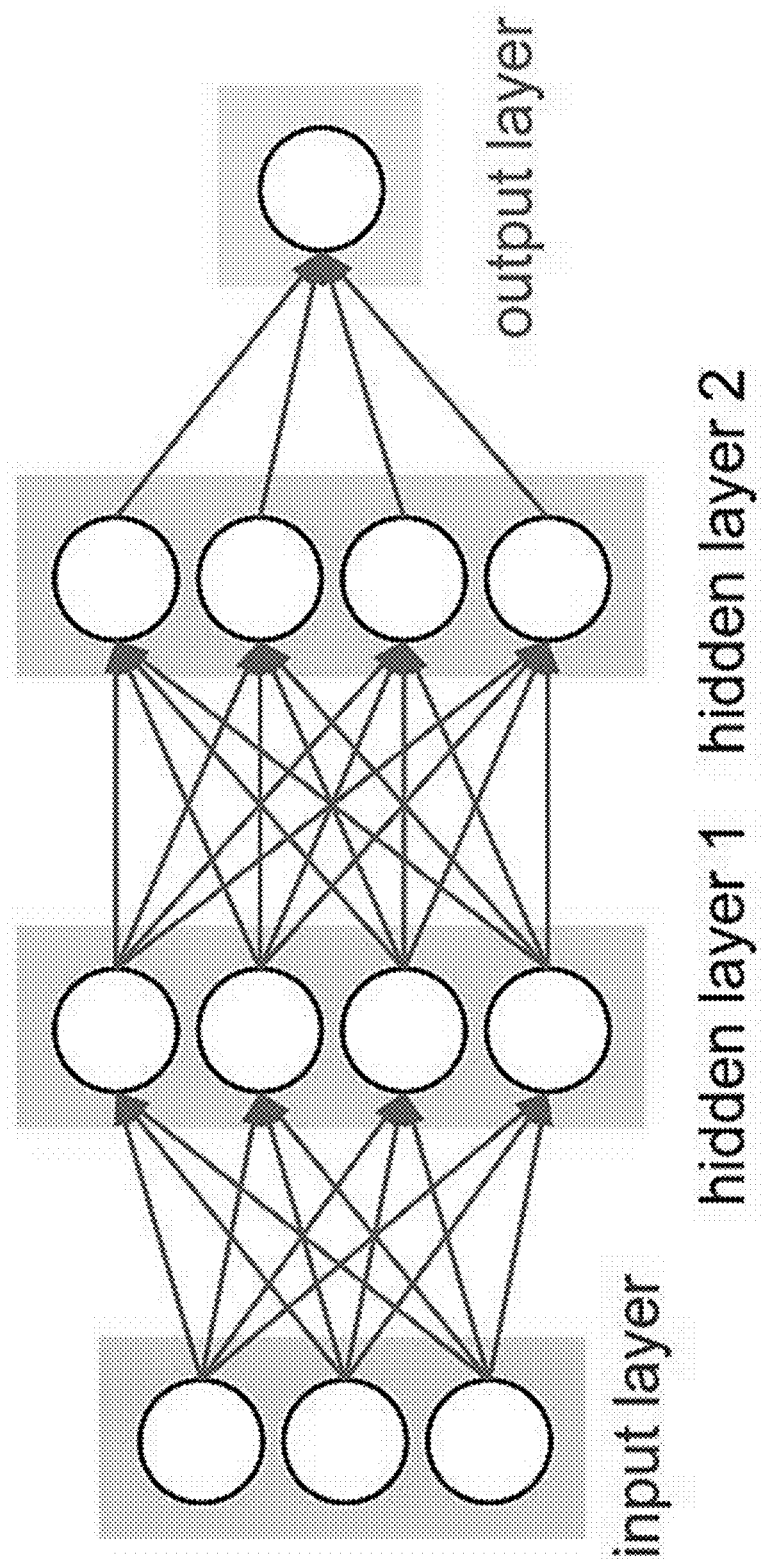
FIG. 2 shows a conceptual example of an artificial neural network of the prior art.
Figure 3:
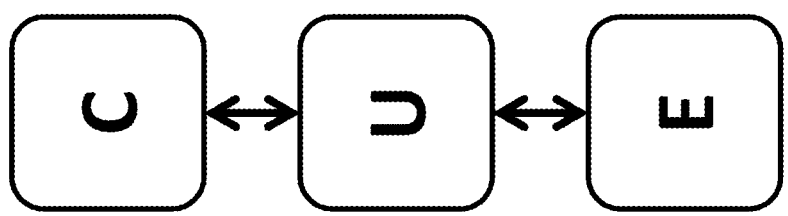
FIG. 3 shows a crude block diagram of a conscious mind and an unconscious mind interacting with the environment, which may be emulated in a conscious machine.

A major illusion of human consciousness is one of unified top-level control. FIG. 3 shows a diagram representing a conscious mind C above an unconscious mind U, which in turn is above the environment E. We believe that our conscious mind controls most of what we do, and that our conscious mind is in direct communication and control of the environment. But psychological research has shown that in many cases, actions are triggered slightly before the conscious mind is aware of them, suggesting that these may actually be directed unconsciously. The conscious mind may take credit for these actions, which form part of a narrative of conscious action. There are other internal experiences of consciousness, including perception of time and space, identification of a unified self linked to past memories, emotions, and actions, and identification of other agents and objects. A consistent explanation of the mind needs to account for all of these. Further, neither C nor U is fully rational, but U creates a consistent simplified narrative that C experiences. The present application proposes that similar aspects may be emulated in a conscious machine, with a similar organization.

Figure 4:
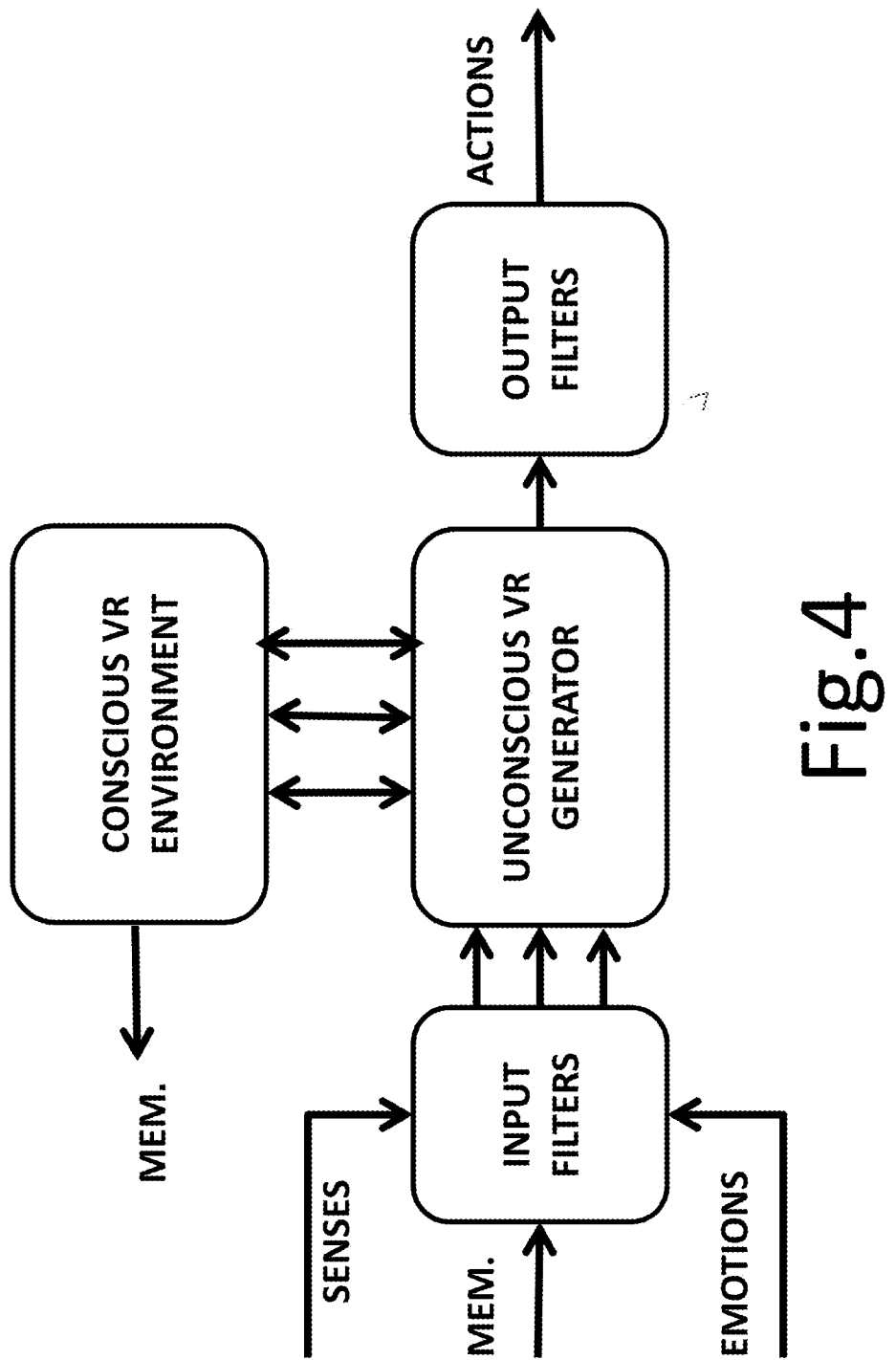
FIG. 4 shows a preferred embodiment of a conscious computing module and an unconscious computer module, together with input and output structures.

Many aspects responsible for human consciousness are hidden from view, and may not be evident either in the structure of the brain or in the internal experience of consciousness. But as disclosed here, consciousness seems to involve a self-identified agent following a continuous, causal narrative in a dynamic virtual environment. The environment must integrate various sensory modalities with relevant emotions and memories. This is shown in FIG. 4, which shows consciousness as a virtual reality (VR) construct created from filtered input data, and representing a simplified dynamic model of the reality. The interaction with the external environment occurs via filtered inputs and outputs to the unconscious mind, where most of the detailed coordination and decision takes place. The VR environment represents the self, acting in a simplified environment, comprised of objects and other agents. Previous frames of the VR are saved in memory, and may be retrieved as needed.

A conscious visual representation of an object (such as a rose) is not just a portion of a larger two-dimensional image. Rather, it is an object embedded in a three-dimensional space, which represents the concept of a rose and links to abstract attributes and memories of images and aromas (even if ancillary sensory stimulation, such as smell, is not currently present). This may be analogous to a PDF file of a scanned document which is subjected to optical character recognition (OCR). Such a file contains an image of a given page, but the image of each character is also associated with the functional representation of the character. Now imagine that the document also contains embedded links to definitions of words and other relevant documents, and one starts to have the richness necessary for consciousness. In contrast to a static environment of a document, the VR environment is highly dynamic, and is rapidly updated in time.

Figure 5:
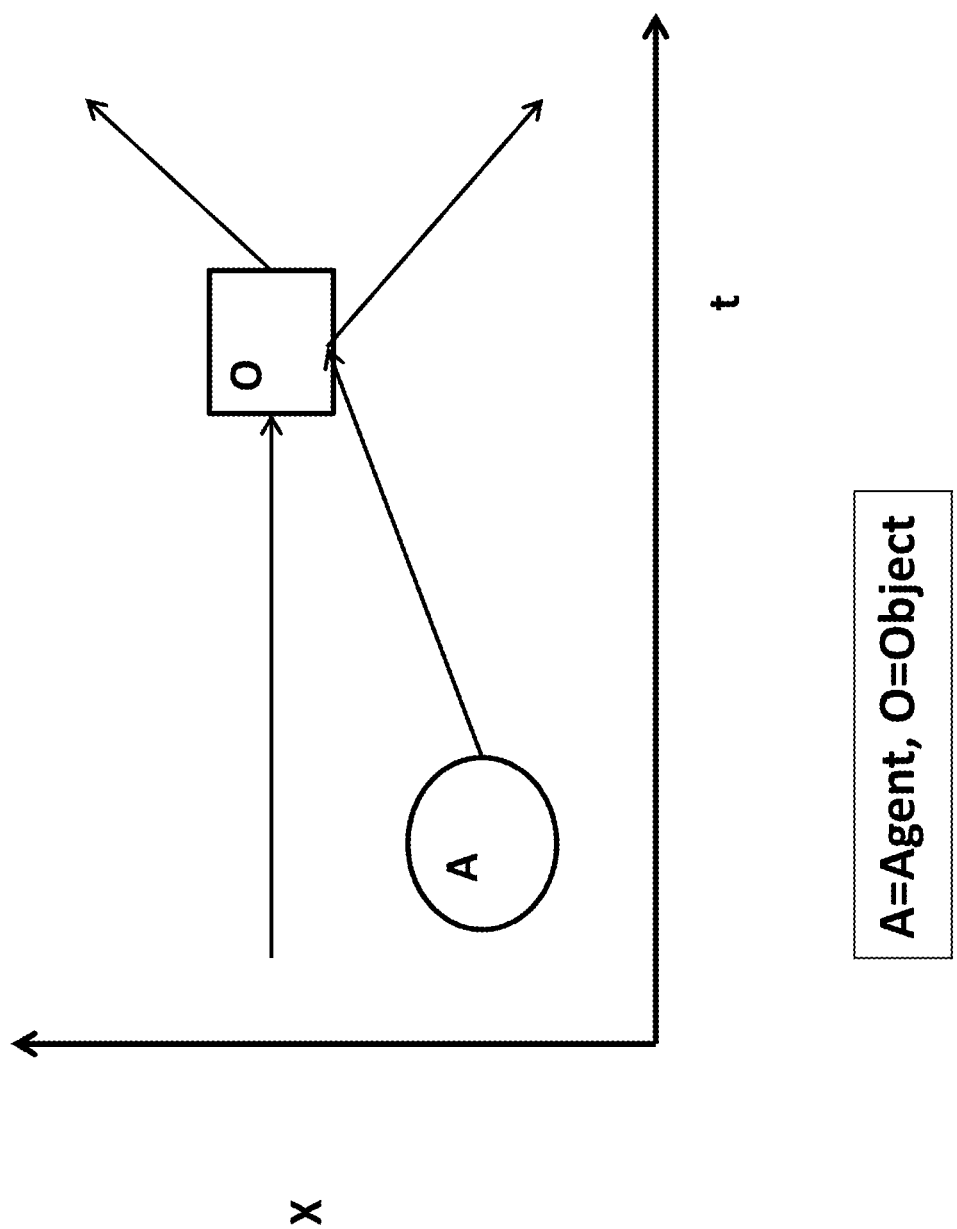
FIG. 5 shows an agent moving in an environment and causing an object to move.
Figure 6:
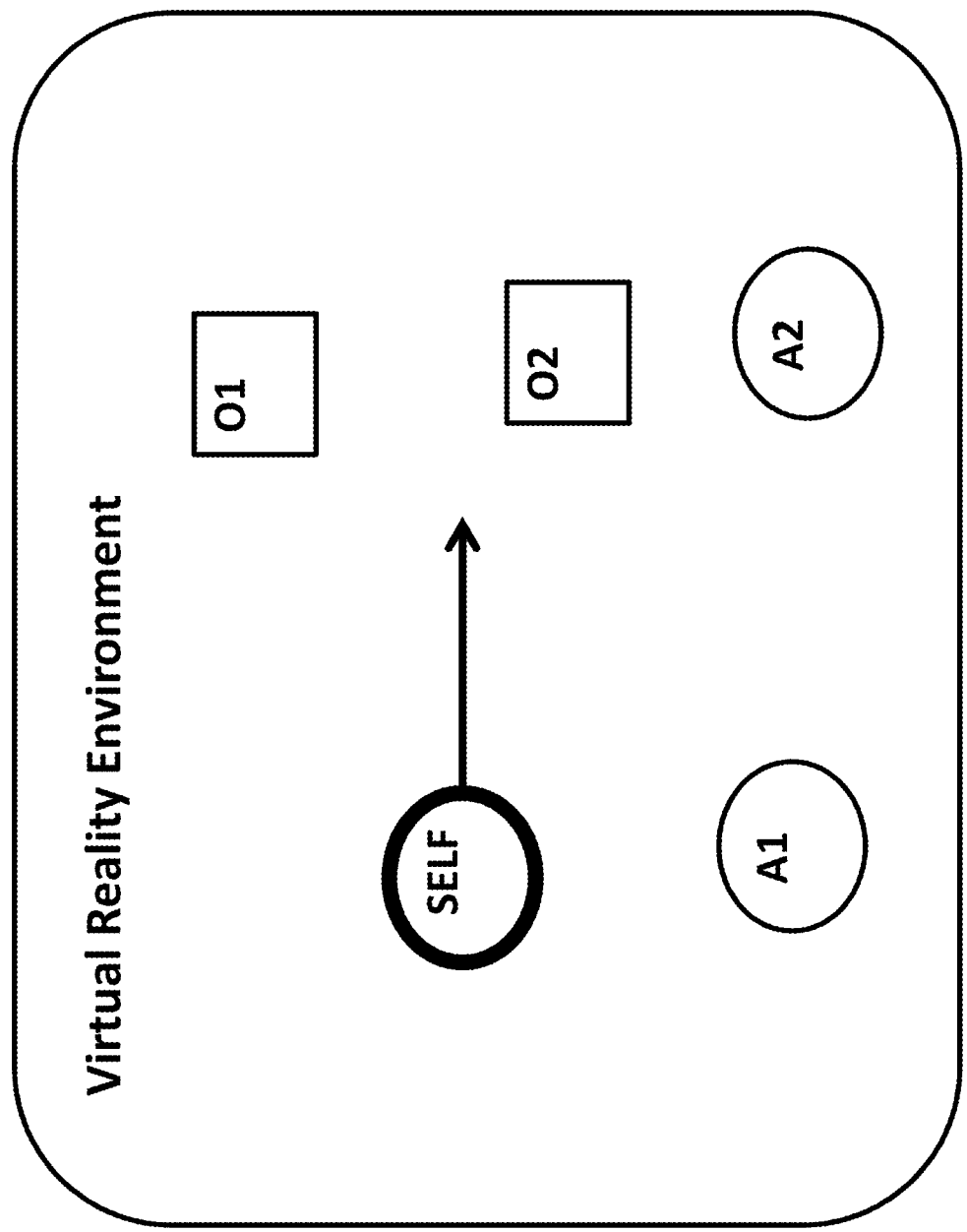
FIG. 6 shows a conceptual diagram of a virtual reality environment with the self, other agents, and objects.

Another aspect of consciousness is the subjective sense of agency. This is created by activation of an adaptive neural net, primed to recognize self-agency and causality, and also to recognize external agents. The dynamic VR is built around such actors, as shown in FIG. 6. Note that recognition of agency is really a form of temporal pattern recognition, as suggested in FIG. 5, which shows an agent moving up to a fixed object, which then starts to move. We live in a world that is continuous and causal, so that simplified causal models based on observed temporal correlations are generally highly functional. Furthermore, this is a case of dynamic learning; the mind learns to generate and refine a simplified model which maintains effective representation of the external environment.

A further aspect of consciousness is a sense of urgency or priorities. Often, the issues have different objective classifications, and the ranking requires some normalization of different classes of issues. A cost or distance function may therefore be included within the model. Consistent with our understanding of consciousness, this ranking or ranking function may be highly dynamic, and have what are apparently irrational characteristics, with biases, systematic "errors", and other "personal" characteristics. While in some cases, such as an autonomous vehicle controller is desired to avoid unpredictable action or irrational behavior, in other cases, it is exactly these attributes that make the system better appear as being conscious.

Figure 7:
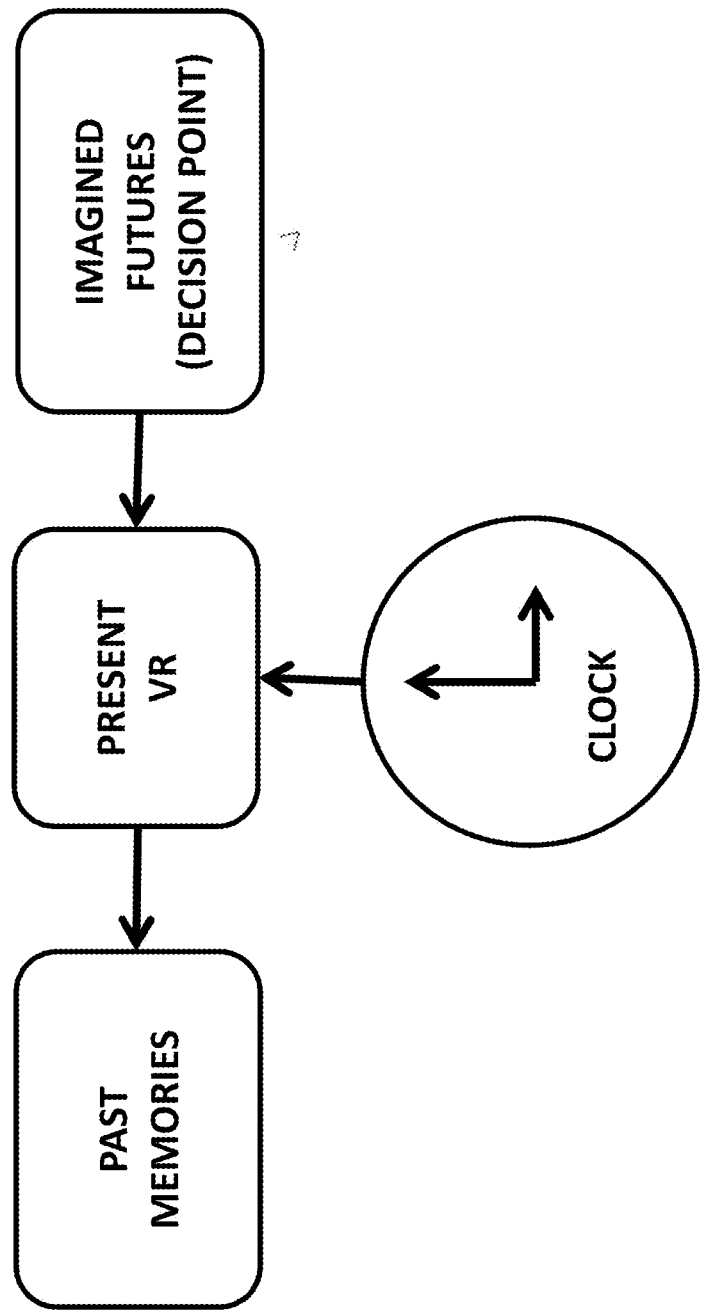
FIG. 7 presents a preferred embodiment of a memory structure and time base for a conscious machine.

In a further key aspect, this view of a conscious mind or a conscious machine requires both a clock and a memory structure. Consider a short-term dynamic memory module, containing the recent past, and a predictive model of one or more near futures, as shown in FIG. 7. A clock time-stamps the present frame and shifts it to the past. Two alternative futures may be presented, based on present actions. When one action is selected, this shifts that future into the present. This ensures that perceived time is a central element in consciousness. The subjective sense of self is associated with the repeated activation of self-recognition circuits, mapping the present self onto the past self.

Longer term memories are also stored, possibly in another location, based on a different technology. These may be retrieved either by time reference or by content. The memory elements may be VR frames, but other parameters abstracted from one or more prior experiences may be independently stored and retrieved.

The presence of a conscious VR module does not preclude a machine or mind from also incorporating unconscious perception and control via neural circuits that do not interact with consciousness. For example, detailed coordination of specific muscles in walking or running is an essential part of brain activity, but is generally completely inaccessible to the conscious mind. Similarly, a conscious machine will incorporate a hybrid approach, assigning to the conscious module only those aspects that cannot be achieved efficiently by a more conventional machine learning approach.

Indeed, we are accustomed to think of consciousness as a superior form of brain activity, but it might be better to think of a conscious mind as a specialized niche processor that should only be used as a last resort. For example, consider a car driving along a road, with a large puddle in the road. Is this a shallow puddle that one should simply drive through, or a deep pothole that should be avoided? If the answer is obvious, this need not rise to the level of consciousness. But if it requires a more complex assessment of weather conditions and the local status of road repair, the decision needs to be made at a higher level. There is a danger in this—such high level decisions based on incomplete data can be slow, at a time when a rapid decision is necessary. And the decision can still turn out to be the wrong one. However, any system that significantly increases the likelihood of improved decision making has substantial value, for a self-driving car or other autonomous system. For example, a conscious system might further consider ramifications of error (or success). If the puddle is shallow, and the vehicle swerves to avoid it, what are the risks of accident or discomfort for the passengers? If the puddle is deep and the tire hits it, what damage could occur? If the car brakes suddenly, what is the risk of skidding or a rear-end accident? Etc.

Figure 8:
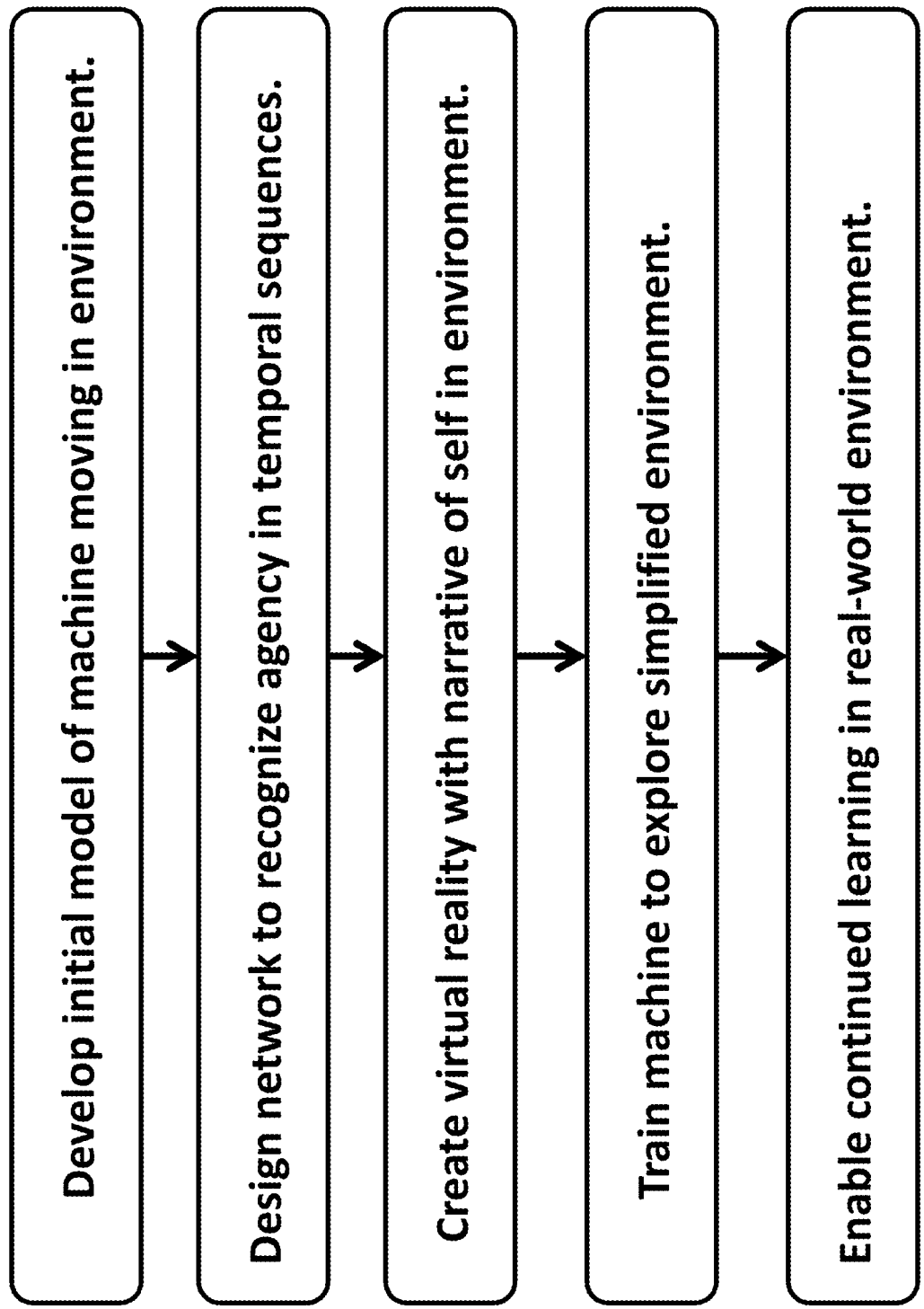
FIG. 8 presents a flow chart for a preferred method for designing and training a conscious machine.

As with other neural network systems, the initial design and training of a conscious machine are essential, and a simplified flowchart of steps in initializing a conscious module are presented in FIG. 8. The first step is to design an initial model for the machine moving in its environment. What are the important sensors and actuators needed, and what are the relevant timescales? Second, the neural network must be configured to evaluate sequences in time and space, and designed to use temporal pattern recognition to identify agents in the environment. The most important agent is the "self", which is correlated with the sensors and actuators. Other agents and objects can also be identified, and a virtual reality environment can be generated based on the interactions of the self with these other agents and objects. This machine can be trained initially using a simplified external environment. In some cases, the initial training environment might be a computerized VR system. Finally, the machine can be transferred to the real world, where learning will continue. Throughout the training and learning, a method to monitor the internal VR environment would be highly advantageous. This would be preferable to simply observing the functional behavior. One can imagine that training young children or animals would be much easier if we could really read their minds!

It is known in the prior art that deep neural networks may be implemented in a variety of technologies, including digital and analog circuits, biological neurons, CMOS transistors, superconducting Josephson junctions, memristors, phase-change memories, and resistive RAMs, based on pulse or voltage-level logic. They may be implemented in a variety of circuit architectures, including not only conventional processors, but also special-purpose processors such as GPUs, TPUs, and FPGAs. The deep neural networks comprising a conscious machine may in principle be implemented on any device technology and architecture that may be configured to support temporal pattern recognition, and to identify agents of change in the virtual environment created by the set of sensory inputs.

This temporal pattern recognition represents a repeated process activated by a periodic clock which establishes a time base. The frequency of this updating can be relatively slow if the systems deals with slow changes in typical human environments; for comparison, the alpha rhythm in human brains is of order 10 Hz. But electronic systems are capable of much faster operation, so that faster updating might be appropriate for application to a rapidly moving autonomous vehicle, for example.

In order to be able to act with a sufficient level of sophistication in a complex environment, the neural network of a conscious machine must comprise a large number of neurons with an even larger number of interconnections. For example, the network must have at least millions of neurons, with at least billions of interconnections. The strengths of the interconnections representing memories and associations must preferably be non-volatile over long periods of time, or at least fully backed up in case of power failure. The memories must be capable of repeated adjustment and readout, with high reliability and very low rate of failure. The system should be able to be temporarily turned off, so that repairs or upgrades may be implemented, and then turned back on in a way that remembers past performance.

The neural networks comprising a conscious machine must be capable of learning during an initial supervised or unsupervised training period, but should also continue to learn during full operation in the field. In this way, a conscious machine comprising a robot or autonomous vehicle could be optimized for operation in an environment with distinct but unpredicted characteristics.

Furthermore, in some cases, the initial training period may be accelerated by pre-programming some of the interconnections, based on a readout of the internal interconnections of another conscious machine that has already been trained. This effectively comprises implanting a set of artificial memories and experiences into a given machine consciousness. It may be advantageous to use such a procedure to create a plurality of identically trained conscious machine twins or clones. In this way, a standard machine with reliable and validated performance may be efficiently mass-produced. Further adaptation to custom environments may be obtained in the field.

Biological neural networks are not normally designed to read out their internal connections, but if such a readout were available, it could in principle enable an artificial system to emulate aspects of the mind of a biological organism. That could enable, for example, the creation of an artificial pet that could better emulate some aspects of the behavior of a biological pet.

Figure 9:
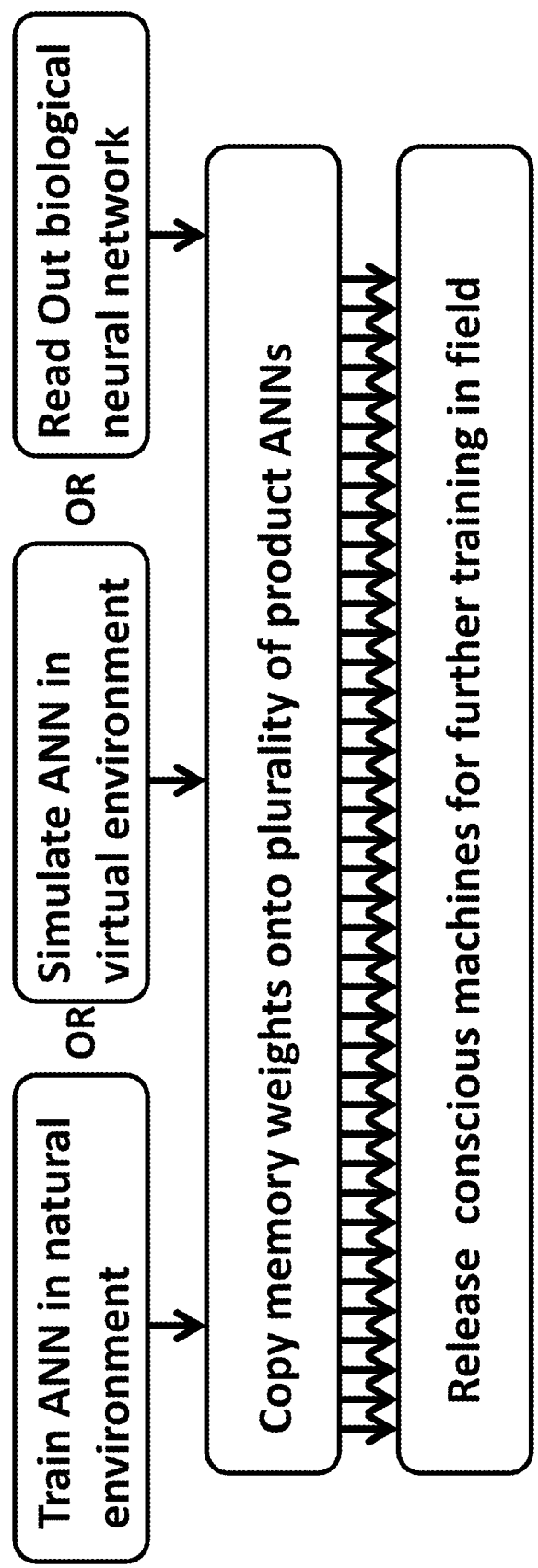
FIG. 9 shows alternative modes of programming artificial neural networks (ANNs) for conscious machines.

These alternative modes of programming artificial neural networks (ANNs) for conscious machines are illustrated in the block diagram of FIG. 9. The memory weights in the interconnections of the ANN may be determined by simulating a conscious machine in a virtual environment, or by training the machine in a natural environment, or even by reading out the states of an analogous biological neural network (should that become feasible). These can then be written to the states of untrained ANNs of a plurality of conscious machines. These machines can then be distributed to customers, where further learning in a variety of natural environments can continue.

Biological behavior in social animals may be governed in part by issues of cooperation and competition. Cooperation depends in part on empathy, the ability to project the perspective of another agent on one's own perspective, in order to better predict the action of other agents. This may be associated with "mirror neurons" in biological neural nets. Competition in social animals may depend on dominance hierarchies, which provide rules to negotiate differences in order to avoid conflict. In an environment which may comprise a plurality of both people and conscious machines, it may be important that the machines incorporate mechanisms of both cooperation and competition. Similar issues have been anticipated in the literature of science fiction, for example in the Three Rules of Robotics of Isaac Asimov (en.wikipedia.org/wiki/Three_Laws_of_Robotics).

Indeed, in an environment of interacting conscious machines, an exchange of virtual reality environments between cooperative agents may occur, so that one machine can better predict outcomes of interactions with other machines, and improve its own virtual reality environment. Such inter-machine communication could be acoustic or visual, but it could also occur via wireless rf communication channels. Of course, in some cases, agents are competitive, and this exchange would be disfavored.

One aspect of biological consciousness that is not generally considered for artificial intelligence is the role of sleep and dreams. But sleep and dreams are universal among animals, and their deprivation is highly deleterious, suggesting that they must serve an important function, even if it not well understood. Some recent research has suggested that neural interconnections in animals grow dramatically during the day, but are selectively pruned back during sleep. This can be a form of consolidating learning, which may be important to emulate in machine systems. Furthermore, dreams are associated with rapid eye movement (REM), which is also common among animals, suggesting that they, too, dream during sleep. Dreams are a form of virtual reality that is somewhat similar to the real-world experience. The difference, of course, is that there is no sensory input during dreams, but there is still a sense of self and a dynamic narrative. Dreams may also represent part of the learning process. A conscious machine could also operate without sensor input, but with some low-level activation of memories. Perhaps we will know that we have made conscious machines when we can observe them dream.

A conscious machine might present another issue that is normally restricted to brains: mental illness. For example, malfunctioning of the VR generator may present distorted perceptions or narratives, which might be analogous to paranoia or schizophrenia. Furthermore, memory activation thresholds that are too high or too low might cause hyperactivity, depression, or obsessive behavior. While this is purely speculative at present, it may be important to monitor a conscious machine for abnormal behavior or thoughts. From another point of view, a malfunctioning conscious machine might even represent a model for human mental behavior.

Finally, a reliable, inexpensive, conscious machine would enable a wide range of potential applications, many of which have not even been considered. Going beyond autonomous vehicles or intelligent digital assistants, one can imagine a variety of security and military applications, from surveillance to monitoring the Internet to active defense. Similarly, one can envision intelligent medical systems for monitoring and diagnosing patients, in the absence of medical personnel. Alternatively, one might have an artificial pet, a companion without some of the requirements and shortcomings of dogs or cats. The only limit is our own imaginations.

In a medical environment, the conscious machine may seek to model the behavior of a patient. As characteristics of the patient are successfully modelled and their predictive nature verified, it may then be possible to analyze the virtual reality environment to determine deviations from normal, and thus the system could be part of a diagnostic or therapeutic device.

More generally, the system may be used to implement user models, typically within a particular knowledge domain, to provide assistive agents.

While the present invention has been described with respect to a limited number of embodiments, those skilled in the art will appreciate numerous modifications and variations therefrom. It is intended that the appended claims cover all such modifications and variations as fall within the scope of this present invention.

What is claimed is:

1. A conscious machine aware of its self, for achieving a goal involving a change in a relationship between the self, agents and objects within an environment, comprising:
    a set of sensor inputs configured to receive information from an environment;
    an artificial neural network, receiving the set of sensor inputs, and being configured to:
        identify the self, identify the agents, and identify the objects represented in the set of sensor inputs,
        recognize correlated patterns in time and space of the self, the agents and the objects in the environment, and
        plan achievement of the goal through changes in the relationship between the self, the agents and the objects within the environment; and
    at least one automated processor, configured to construct a dynamical predictive model of the environment based on at least the set of sensor inputs that includes the self, interacting with the agents and the objects;
    a set of control outputs from the artificial neural network, dependent on the dynamical predictive model, configured to alter the environment by movement of at least one of the self, at least one agent, or at least one object, to implement the plan for achievement of the goal.

2. The conscious machine of claim 1, wherein a repeated recognition of the self within the dynamical predictive model constitutes a primary attribute of consciousness.

3. The conscious machine of claim 1, further comprising a memory, configured to store earlier representations of the dynamical predictive model, labeled by time and location in the environment.

4. The conscious machine of claim 3, wherein the stored earlier representations of the dynamical predictive model, labeled by time and location in the environment, are retrievable by time.

5. The conscious machine of claim 3, wherein the stored earlier representations of the dynamical predictive model, labeled by time and location in the environment, are retrievable by associated content.

6. The conscious machine of claim 1, wherein the neural network is further configured to learn from experience achieving goals within the environment and interacting with the agents and the objects, subject to a set of predefined guidelines.

7. The conscious machine of claim 1, wherein the dynamical predictive model is further configured to enable prediction of alternative futures, dependent on proposed alternative alterations of the environment by the control outputs, and to comparatively assess the proposed alternative alterations of the environment based on the predicted alternate futures.

8. The conscious machine of claim 1, wherein the control outputs are effective to alter a location monitored by the set of sensor inputs.

9. The conscious machine of claim 1, wherein the dynamical predictive model represents a virtual reality that simulates the environment, and the dynamical predictive model further comprises a causal narrative centered around the self.

10. The conscious machine of claim 9, wherein the dynamical predictive model is monitorable by an external user.

11. The conscious machine of claim 1, wherein the set of sensor inputs comprises visual images.

12. The conscious machine of claim 1, wherein the set of sensor inputs comprises acoustic signals.

13. The conscious machine of claim 1, wherein the set of sensor inputs comprises natural language.

14. The conscious machine of claim 1, wherein the environment comprises a combination of a natural environment and virtual reality environment.

15. The conscious machine of claim 1, wherein the self comprises an autonomous or semi-autonomous vehicle.

16. The conscious machine of claim 1, wherein the artificial neural network is further configured to:
    evaluate the environment according to effects of the environment on the self and represent the evaluation as an emotion; and
    incorporate the emotion into the dynamical predictive model.

17. The conscious machine of claim 1, wherein at least a portion of the artificial neural network comprises a network of interconnected physical electronic devices, each respective interconnected physical electronic device functioning as an artificial neuron.

18. A control method for achieving a goal involving a change in a relationship between an agent, other agents, and objects within an environment, comprising:
    configuring an artificial neural network to accept sensor inputs from the environment and to generate control outputs that affect the environment by movement of at least one of the agent, at least one other agent, or at least one object;

recording temporal sequences in the environment in a memory;

training the artificial neural network to search for correlated temporal patterns in the sensor inputs from the environment, in order to identify the agent, identify the other agents, and identify the objects in the environment;

generating a predictive dynamical model of the environment, based on at least the sensor inputs, that permits predictions of future events involving the agent, the other agents, and the objects, dependent on the control outputs;

updating the model to present a dynamic narrative of the agent in the environment.

19. A self-aware system for achievement of a goal involving an interaction of a self-agent with other agents and non-agent objects in the environment, to achieve a prospective change in a relationship of at least one of the self-agent, the other agents, and the non-agent objects in the environment, comprising:

a set of sensor inputs configured to receive sensor data representing a state of the environment; and at least one automated processor comprising an artificial neural network, receiving the set of sensor inputs, configured to:

identify the self agent, identify the other agents, and identify the non-agent objects in the environment represented in the set of sensor inputs;

recognize correlated dynamic time and space patterns of the self-agent, the other agents, and the non-agent objects in the environment; and construct a dynamical predictive model of the environment that includes the self-agent, interacting with the other agents and the non-agent objects, based on at least the set of sensor inputs; and produce a plan for achievement of a goal involving an interaction of the self-agent with other agents and the non-agent objects in the environment, to achieve the prospective change in a relationship of at least one of the self-agent, the other agents, and the non-agent objects in the environment; and a set of control outputs from the artificial neural network, selectively dependent on the plan for achievement of the goal, and the dynamical predictive model, the set of control outputs being configured to alter the environment by movement of at least one of the self-agent, at least one other agent, or at least one non-agent object.

20. The self-aware system of claim 19, wherein the self-agent comprises an autonomous or semi-autonomous vehicle, and the dynamical predictive model comprises a continuous causal narrative centered around the self-agent.

* * * * *